(12) United States Patent
Lee et al.

(10) Patent No.: US 12,419,160 B2
(45) Date of Patent: Sep. 16, 2025

(54) DISPLAY DEVICE CAPABLE OF REDUCING SIZE OF LIGHT EMISSION AREA THAT BECOMES DARK SPOT

(71) Applicant: LG Display Co., Ltd., Seoul (KR)

(72) Inventors: Saemleenuri Lee, Paju-si (KR); MoonSoo Kim, Paju-si (KR); DoYoung Kum, Paju-si (KR); Sungbin Shim, Paju-si (KR)

(73) Assignee: LG Display Co., Ltd (KR)

( * ) Notice: Subject to any disclaimer, the term of this patent is extended or adjusted under 35 U.S.C. 154(b) by 457 days.

(21) Appl. No.: 17/558,749

(22) Filed: Dec. 22, 2021

(65) Prior Publication Data

US 2022/0209171 A1  Jun. 30, 2022

(30) Foreign Application Priority Data

Dec. 31, 2020 (KR) .................. 10-2020-0188975

(51) Int. Cl.
*H10K 50/814* (2023.01)
*H10K 59/122* (2023.01)
(Continued)

(52) U.S. Cl.
CPC ......... *H10K 59/123* (2023.02); *H10K 50/814* (2023.02); *H10K 59/122* (2023.02); *H10K 59/80515* (2023.02); *H10K 59/80516* (2023.02)

(58) Field of Classification Search
None
See application file for complete search history.

(56) References Cited

U.S. PATENT DOCUMENTS

| | | | |
|---|---|---|---|
| 9,153,632 B2 | 10/2015 | Kim | |
| 2019/0094598 A1* | 3/2019 | Wang | G02F 1/13458 |
| 2021/0143373 A1* | 5/2021 | Kim | H10K 50/84 |

FOREIGN PATENT DOCUMENTS

| | | |
|---|---|---|
| KR | 10-2006-0026243 A | 3/2006 |
| KR | 20140118005 A | 10/2014 |

(Continued)

OTHER PUBLICATIONS

Korean Office Action, dated Sep. 9, 2024 issued in Patent Application No. 10-2020-0188975 (11 pages).

*Primary Examiner* — Sue A Purvis
*Assistant Examiner* — Seyon Ali-Simah Punchbeddell
(74) *Attorney, Agent, or Firm* — Fish & Richardson P.C.

(57) ABSTRACT

A display device includes a substrate provided with a display area for displaying an image by a plurality of subpixels, a plurality of first electrodes provided in each of the plurality of subpixels over the substrate, a plurality of driving transistors provided over the substrate, including an active layer, a gate electrode, a source electrode and a drain electrode, a light emitting layer provided over the plurality of first electrodes, and a second electrode provided over the light emitting layer, each of the plurality of first electrodes includes a plurality of divided electrodes disposed to be spaced apart from each other, a transistor contact portion connected with the driving transistor through a contact hole, and a plurality of connection electrodes provided on the same layer as the active layer of the driving transistor, connecting each of the plurality of divided electrodes with the transistor contact portion, so that a size of a light emission area that can be a dark spot due to occurrence of particles can be substantially reduced or minimized.

20 Claims, 8 Drawing Sheets

(51) Int. Cl.
 *H10K 59/123* (2023.01)
 *H10K 59/80* (2023.01)

(56) References Cited

FOREIGN PATENT DOCUMENTS

| | | |
|---|---|---|
| KR | 10-2014-0137272 A | 12/2014 |
| KR | 10-2016-0082768 A | 7/2016 |
| KR | 10-2017-0038602 A | 4/2017 |
| KR | 20190080204 A | 7/2019 |

* cited by examiner

DISPLAY DEVICE CAPABLE OF REDUCING SIZE OF LIGHT EMISSION AREA THAT BECOMES DARK SPOT

CROSS-REFERENCE TO RELATED APPLICATION

This application claims the priority of Korean Patent Application No. 10-2020-0188975 filed on Dec. 31, 2020, which is hereby incorporated by reference in its entirety.

BACKGROUND

Field of the Disclosure

The present disclosure relates to a display device.

Description of the Background

A display device may include a first electrode, a light emitting layer, and a second electrode, which are sequentially deposited, and may emit light through the light emitting layer when a voltage is applied to the first electrode and the second electrode. In this display device, particles may occur on the first electrode during a manufacturing process, and in this case, a short may occur between the first electrode and the second electrode in the area where the particles occur. For this reason, the display device has a problem in that all of subpixels in which particles occur become dark spots so as not to emit light.

Recently, studies for a transparent display device in which a user may view objects or images positioned at an opposite side by transmitting the display device are actively ongoing.

The transparent display device includes a display area on which an image is displayed, and a non-display area, wherein the display area may include a transmissive area capable of transmitting external light, and a non-transmissive area. The transparent display device may have high light transmittance in the display area through the transmissive area.

The transparent display device has a small sized light emission area due to the transmissive area as compared with a general display device. Therefore, when all of subpixels become dark spots due to particles, luminance deterioration may occur in the transparent display device more remarkably than the general display device.

SUMMARY

The present disclosure has been made in view of various technical problems including the above problems, and various aspects of the present disclosure provide a display device that may reduce or minimize a size of a light emission area that becomes a dark spot.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a display device comprising a substrate provided with a display area for displaying an image by a plurality of subpixels, a plurality of first electrodes provided in each of the plurality of subpixels over the substrate, a plurality of driving transistors provided over the substrate, including an active layer, a gate electrode, a source electrode and a drain electrode, a light emitting layer provided over the plurality of first electrodes, and a second electrode provided over the light emitting layer. Each of the plurality of first electrodes includes a plurality of divided electrodes disposed to be spaced apart from each other, a transistor contact portion connected with the driving transistor through a contact hole, and a plurality of connection electrodes provided on the same layer as the active layer of the driving transistor, connecting each of the plurality of divided electrodes with the transistor contact portion.

In accordance with an aspect of the present disclosure, the above and other technical benefits can be accomplished by the provision of a display device comprising a substrate provided with transmissive areas and a non-transmissive area disposed between the transmissive areas, a driving transistor provided in the non-transmissive area over the substrate, including an active layer, a gate electrode, a source electrode and a drain electrode, a first electrode including a plurality of divided electrodes provided over the driving transistor and a plurality of connection electrodes provided on the same layer as the active layer of the driving transistor, a light emitting layer provided over the first electrode, and a second electrode provided over the light emitting layer.

BRIEF DESCRIPTION OF THE DRAWINGS

The above and other features and other advantages of the present disclosure will be more clearly understood from the following detailed description taken in conjunction with the accompanying drawings, in which.

DETAILED DESCRIPTION

Figure 1:
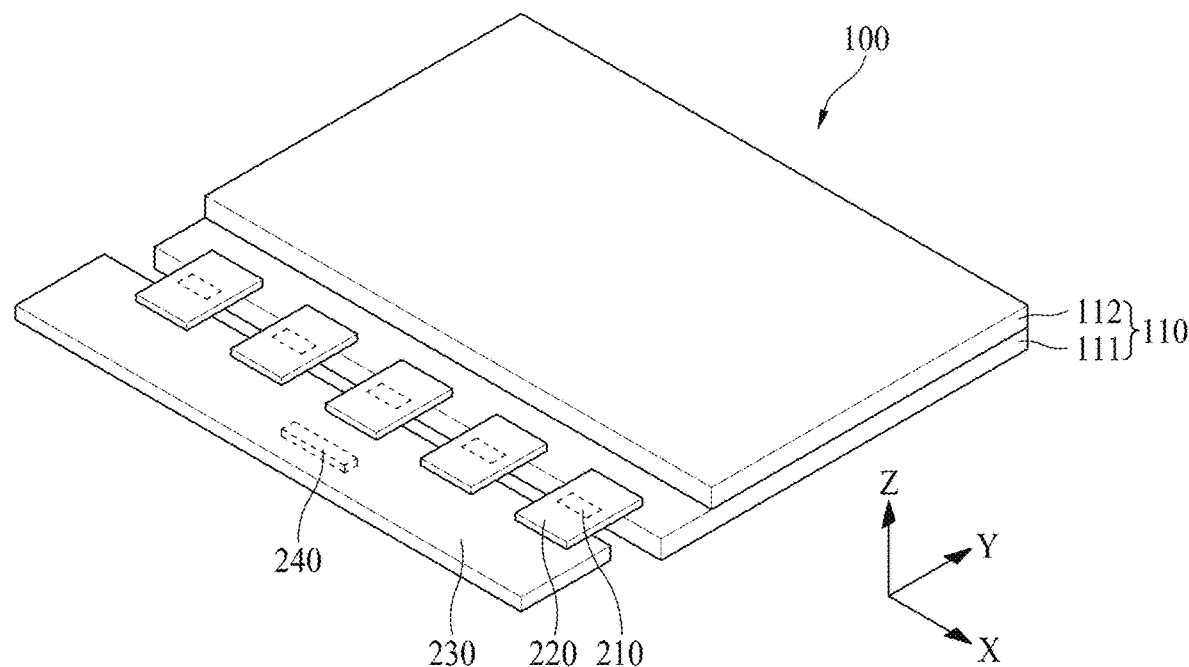
FIG. 1 is a perspective view illustrating a display device according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, an example of a display device according to the present disclosure will be described in detail with reference to the accompanying drawings. Wherever possible, the same reference numbers will be used throughout the drawings to refer to the same or like parts.

FIG. 1 is a perspective view illustrating a display device according to one aspect of the present disclosure.

Hereinafter, X axis indicates a line parallel with a scan line, Y axis indicates a line parallel with a data line, and Z axis indicates a height direction of a display device 100.

Although a description has been described based on that the display device 100 according to one aspect of the present disclosure is embodied as an organic light emitting display device, the display device 100 may be embodied as a liquid crystal display device, a plasma display panel (PDP), a Quantum dot Light Emitting Display (QLED) or an Electrophoresis display device.

Referring to FIG. 1, the display device 100 according to one aspect of the present disclosure includes a display panel 110, a source drive integrated circuit (IC) 210, a flexible film 220, a circuit board 230, and a timing controller 240.

The display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the display panel 110, or the non-display area of both peripheral sides of the display panel 110 by a gate driver in panel (GIP) method. In another way, the scan driver may be manufactured in a driving chip, may be mounted on the flexible film, and may be attached to one peripheral side or both peripheral sides of the display area of the display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
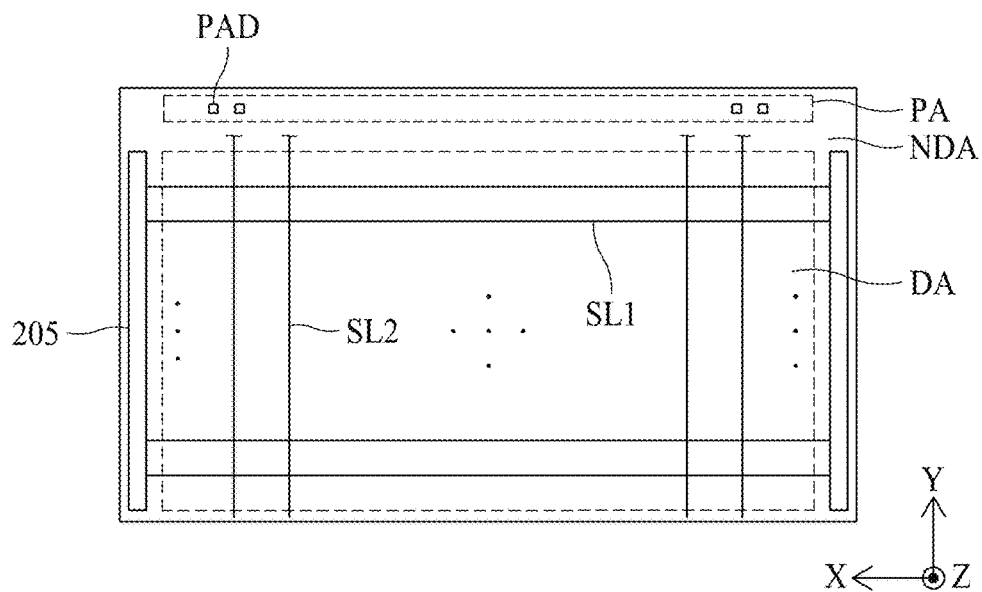
FIG. 2 is a schematic plane view illustrating a display panel according to one aspect of the present disclosure.
Figure 3:
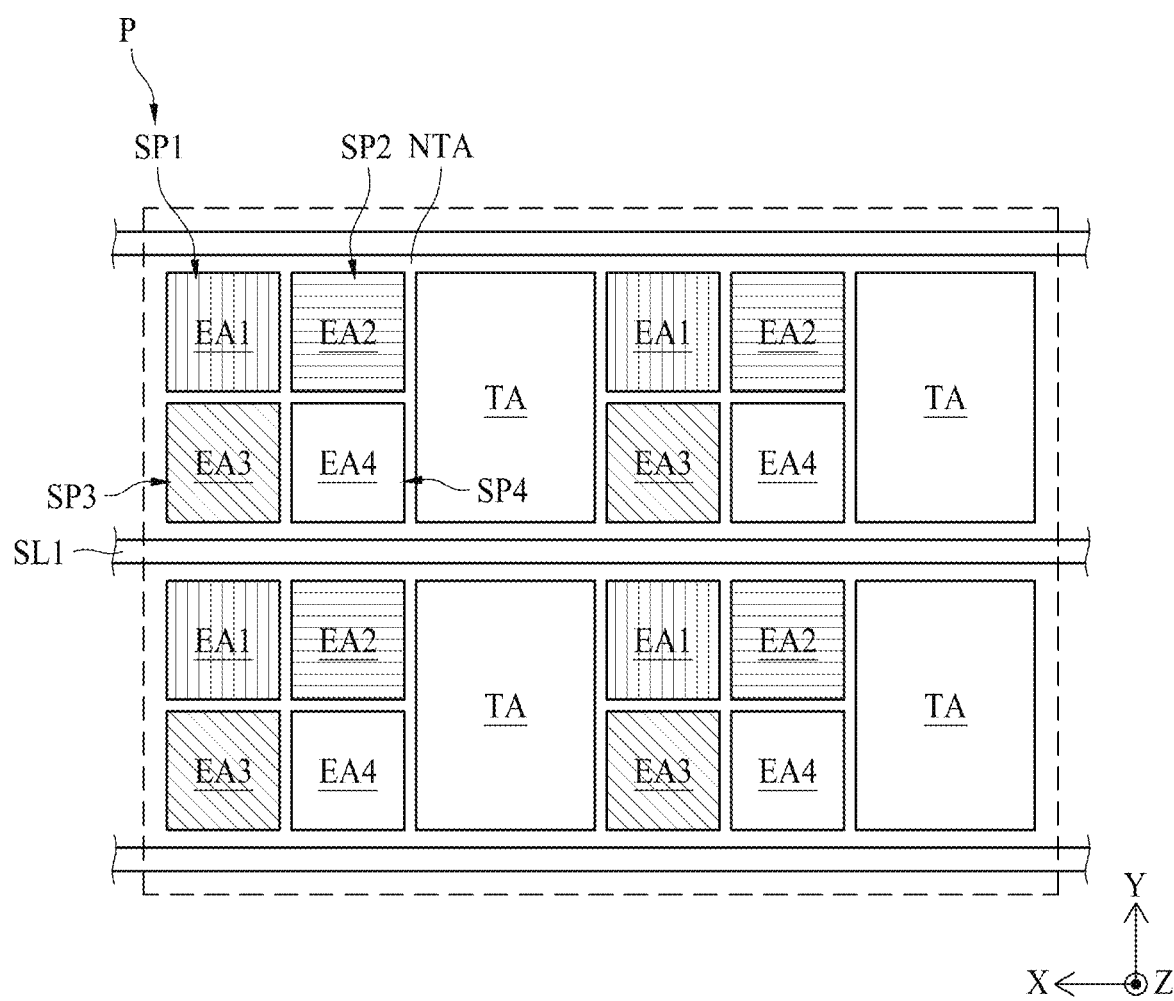
FIG. 3 is a view illustrating an example of a pixel provided in a display panel.
Figure 4:
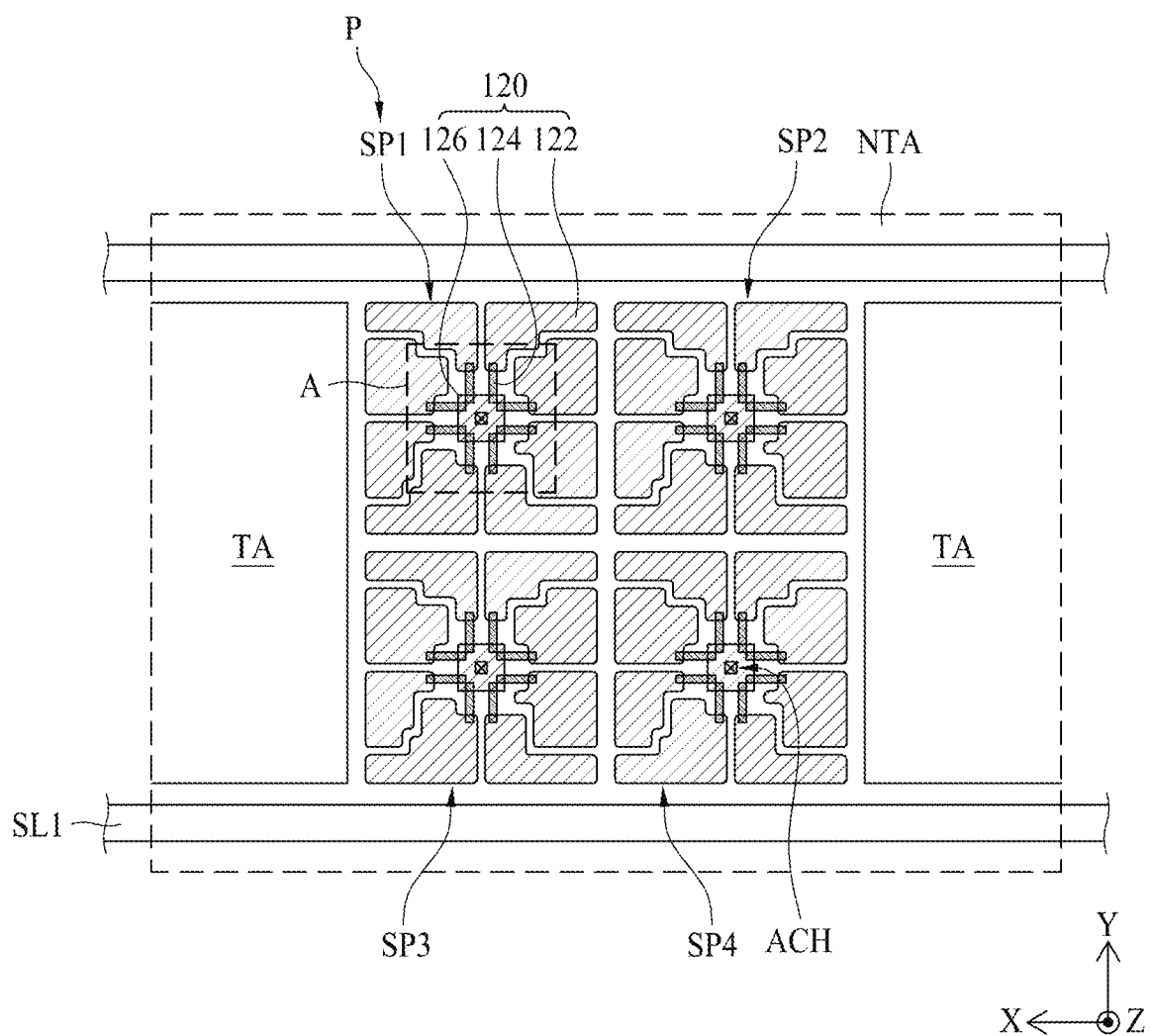
FIG. 4 is a view illustrating a first electrode provided in the pixel shown in FIG. 3.
Figure 5:
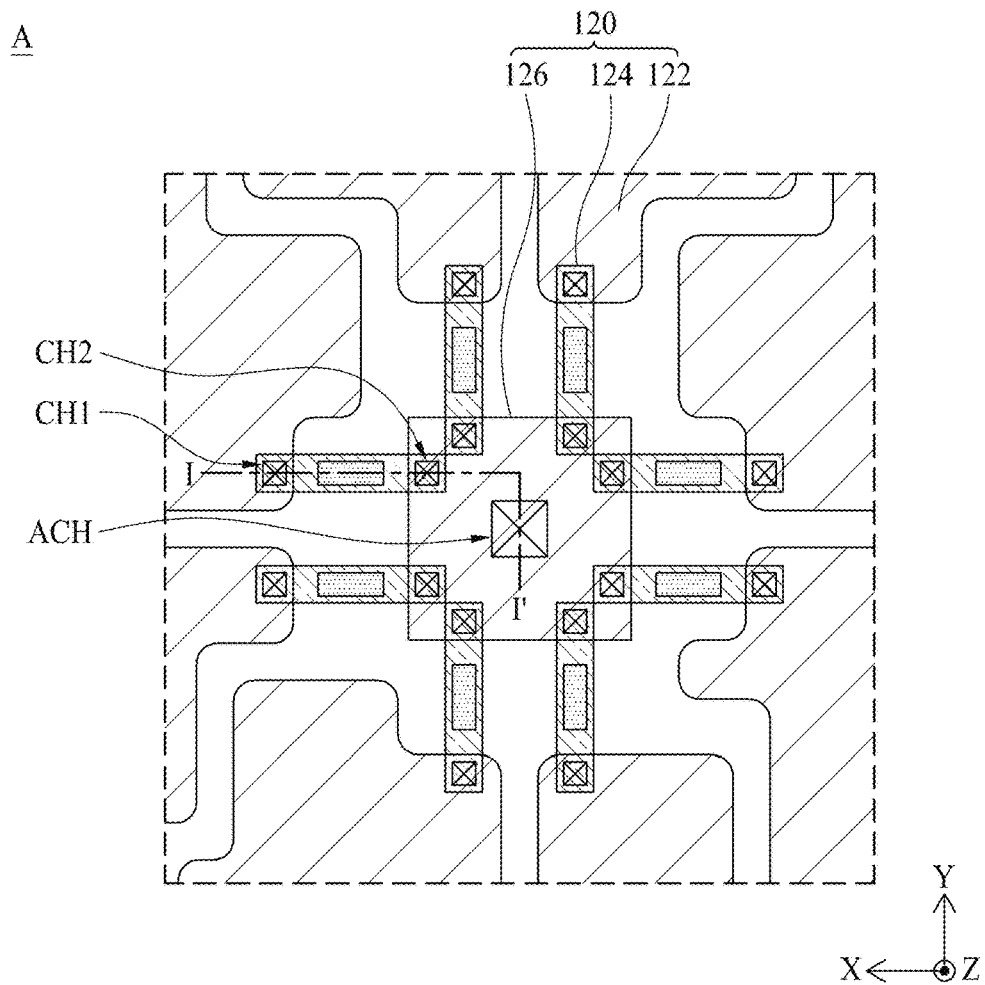
FIG. 5 is an enlarged view illustrating an area A of FIG. 4.
Figure 6:
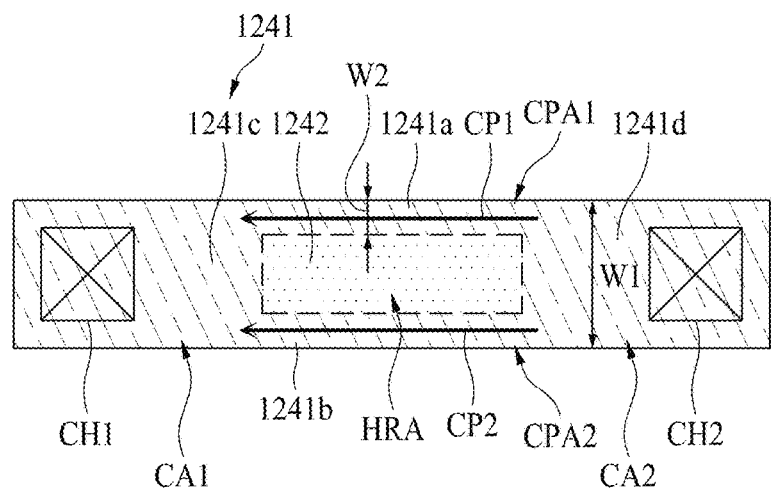
FIG. 6 is a view illustrating a connection electrode shown in FIG. 4.
Figure 7:
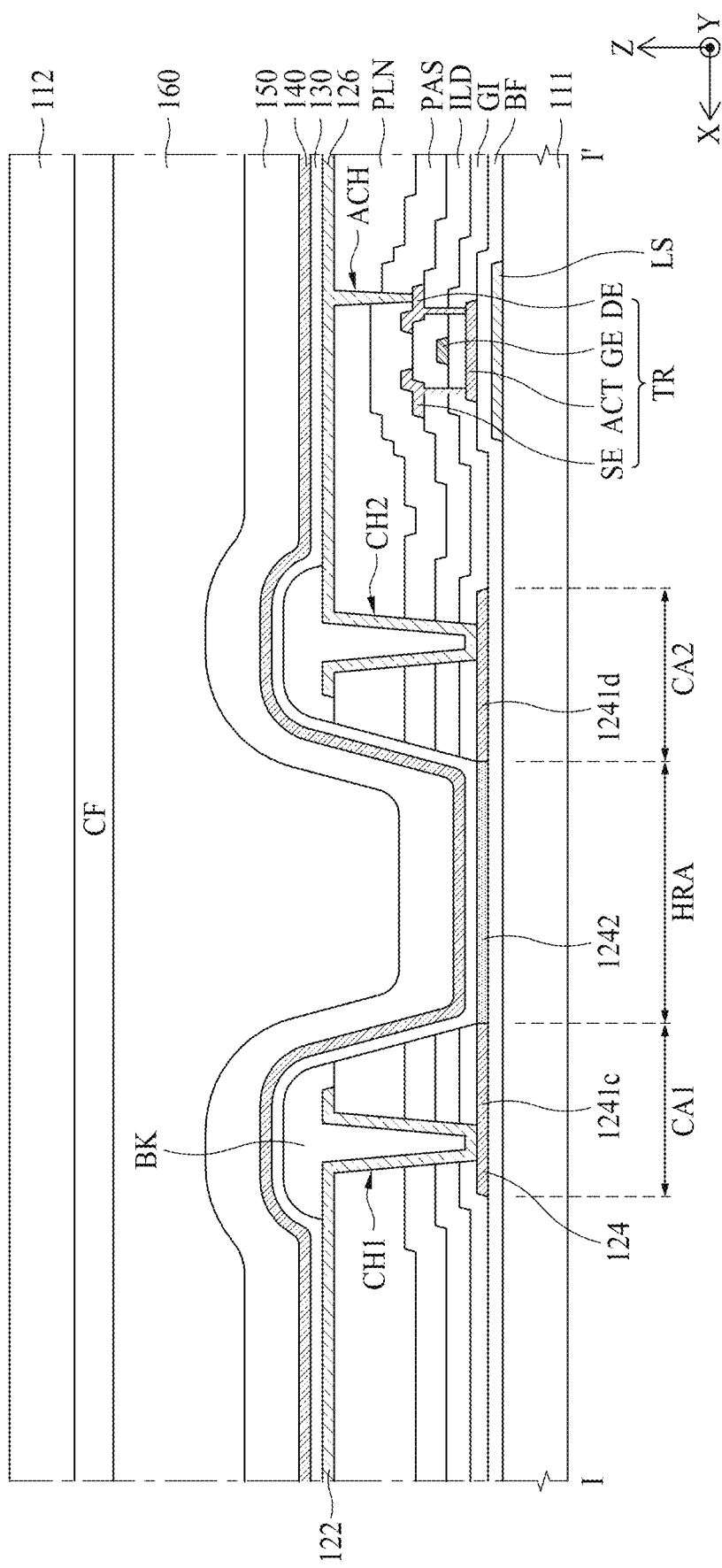
FIG. 7 is a cross-sectional view illustrating an example of line I-I' of FIG. 5.

FIG. 2 is a schematic plane view illustrating a display panel according to one aspect of the present disclosure, FIG. 3 is a view illustrating an example of a pixel provided in a display panel, and FIG. 4 is a view illustrating a first electrode provided in the pixel shown in FIG. 3. FIG. 5 is an enlarged view illustrating an area A of FIG. 4, and FIG. 6 is a view illustrating a connection electrode shown in FIG. 4. FIG. 7 is a cross-sectional view illustrating an example of line I-I' of FIG. 5, and FIG. 8 is a view illustrating an example that particles occur in one of a plurality of divided electrodes in FIG. 7.

In the following description, although the display panel 110 is embodied as a transparent display panel, the display panel 110 may be embodied as a general display panel in which a transmissive area TA is not provided.

Figure 8:
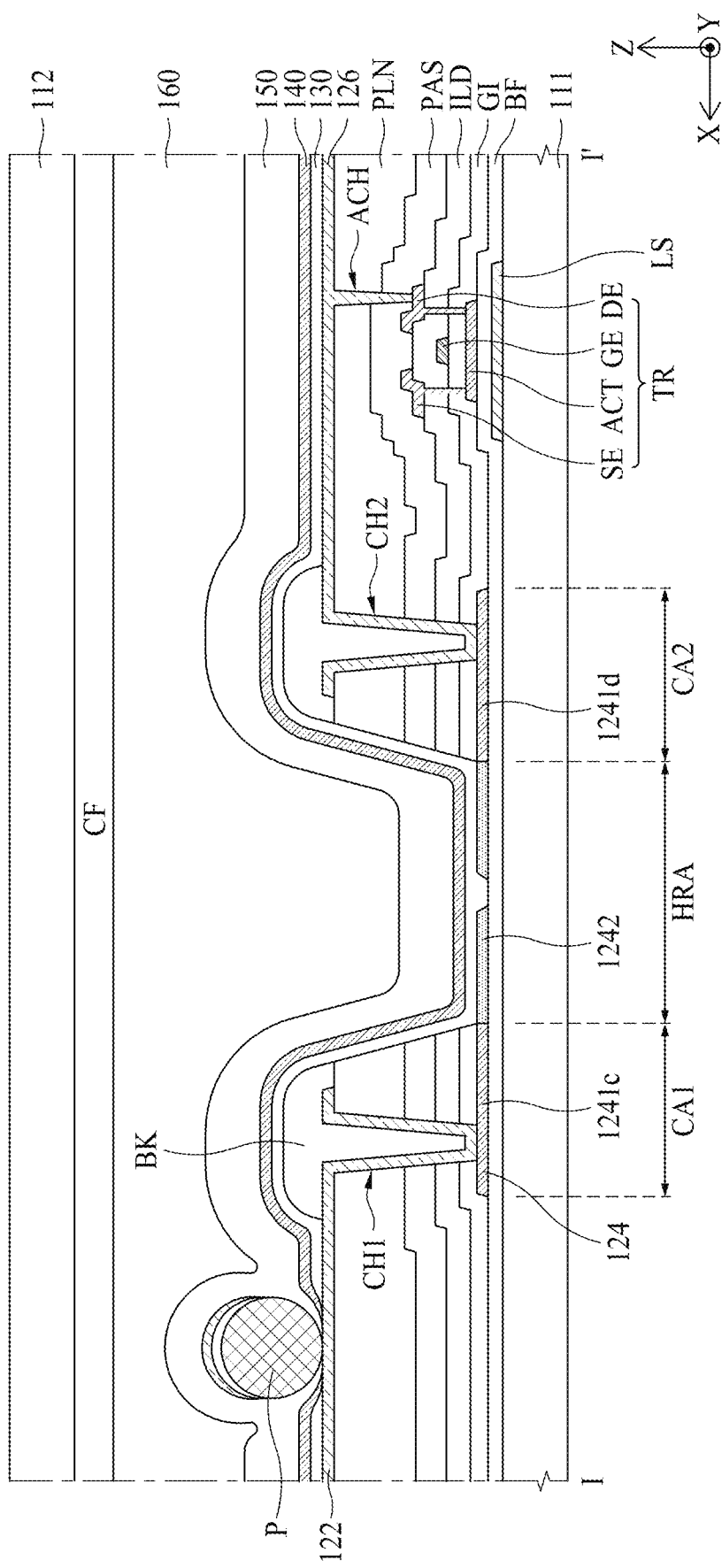
FIG. 8 is a view illustrating an example that particles occur in one of a plurality of divided electrodes in FIG. 7.

Referring to FIG. 2 and FIG. 8, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the display panel 110, or the non-display area NDA of both peripheral sides of the display panel 110 by a gate driver in panel (GIP) method. For example, as shown in FIG. 2, the scan driver 205 may be provided in both side of the display area DA of the display panel 110, but these scan drivers are not limited thereto. The scan driver 205 may be provided only in one side of the display area DA of the display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than $\alpha$%, for example, about 90%, and the non-transmissive area NTA may be an area where light transmittance is smaller than β %, for example, about 50%. At this time, α is greater than β. A user may view an object or background arranged over a rear surface of the display panel 110 due to the transmissive area TA.

The non-transmissive area NTA may include a plurality of pixels P, and a plurality of first and second signal lines SL1 and SL2 for supplying signals to the plurality of pixels P, respectively.

The plurality of first signal lines SL1 may be extended in a first direction (e.g., X-axis direction). The plurality of first signal lines SL1 may cross the plurality of second signal lines SL2. Each of the plurality of first signal lines SL1 may include at least one scan line.

Hereinafter, when the first signal line SL1 includes a plurality of lines, one first signal line SL1 may refer to a signal line group including a plurality of lines. For example, one first signal line SL1 may refer to a signal line group including two scan lines.

The plurality of second signal lines SL2 may be extended in a second direction (e.g., Y-axis direction). Each of the plurality of second signal lines SL2 may include at least one of at least one data line, a reference line, a pixel power line, or a common power line.

Hereinafter, when the second signal line SL2 includes a plurality of lines, one second signal line SL2 may refer to a signal line group including a plurality of lines. For example, one second signal line SL2 may refer to a signal line group including two data lines, a reference line, a pixel power line and a common power line.

A transmissive area TA may be disposed between adjacent first signal lines SL1. In addition, the transmissive area TA may be disposed between adjacent second signal lines SL2. As a result, the transmissive area TA may be surrounded by two first signal lines SL1 and two second signal lines SL2.

Pixels P may be provided to overlap at least one of the first signal line SL1 and the second signal line SL2, thereby emitting predetermined light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a red color. The second subpixel P2 may include a second emission area EA2 emitting light of a green color. The third subpixel P3 may include a third emission area EA3 emitting light of a blue color. The fourth subpixel P4 may include a fourth emission area EA4 emitting light of a white color. However, the emission areas are not limited to this example. Each of the pixels P may further include a subpixel emitting light of a color other than red, green, blue and white. Also, the arrangement order of the subpixels P1, P2, P3 and P4 may be changed in various ways.

Hereinafter, for convenience of description, the description will be given based on that a first subpixel P1 is a red subpixel emitting red light, a second subpixel P2 is a green subpixel emitting green light, a third subpixel P3 is a blue subpixel emitting blue light, and a fourth subpixel P4 is a white subpixel emitting white light.

Each of the plurality of pixels P may be provided in the non-transmissive area NTA disposed between the transmissive areas TA. The plurality of pixels P may be disposed to be adjacent to each other in the non-transmissive area NTA in the second direction (e.g., Y-axis direction). For example, two of the plurality of pixels P may be disposed to be adjacent to each other in the non-transmissive area NTA with the first signal line SL1 interposed therebetween.

Each of the plurality of pixels P may include a first subpixel SP1, a second subpixel SP2 and a third subpixel SP3, and may further include a fourth subpixel SP4 in accordance with one aspect. Each of the plurality of pixels P may include a first subpixel SP1, a second subpixel SP2, a third subpixel SP3 and a fourth subpixel SP4, which are disposed in a grid structure. For example, each of the plurality of pixels P may include a first subpixel SP1, a second subpixel SP2, a third subpixel SP3 and a fourth subpixel SP4, which are disposed around a middle area. In this case, the middle area may indicate an area that includes a middle portion of each pixel P and has a predetermined size.

In detail, the first and second subpixels SP1 and SP2 may be disposed to be adjacent to each other based on the middle area of the pixel P in the first direction (e.g., X-axis direction), and the third and fourth subpixels SP3 and SP4 may be disposed to be adjacent to each other based on the middle area of the pixel P in the first direction (e.g., X-axis direction). One of the first and second subpixels SP1 and SP2 may be disposed to be adjacent to one of the third and fourth subpixels SP3 and SP4 in the second direction (e.g., Y-axis direction).

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor and a driving transistor TR.

In the display panel 110, the plurality of signal lines as well as the first subpixel SP1, the second subpixel SP2, the third subpixel SP3 and the fourth subpixel SP4 should be disposed in the non-transmissive area NTA except the transmissive area TA. Therefore, the first subpixel SP1, the second subpixel SP2, the third subpixel SP3 and the fourth subpixel SP4 may overlap at least one of the first signal line SL1 or the second signal line SL2.

Although the first subpixel SP1, the second subpixel SP2, the third subpixel SP3 and the fourth subpixel SP4 overlap at least a portion of the second signal line SL2 but do not overlap the first signal line SL1 as shown, the aspect of the present disclosure is not limited thereto. In another aspect, at least a portion of the first subpixel SP1, the second subpixel SP2, the third subpixel SP3 and the fourth subpixel SP4 may overlap at least a portion of the first signal line SL1.

The plurality of signal lines may include a first signal line SL1 extended in a first direction (e.g., X-axis direction) and a second signal line SL2 extended in a second direction (e.g., Y-axis direction) as described above.

The first signal line SL1 may include a scan line. The scan line may supply a scan signal to the subpixels SP1, SP2, SP3 and SP4 of the pixel P.

The second signal line SL2 may include at least one of at least one data line, a reference line, a pixel power line or a common power line.

The reference line may supply a reference voltage (or an initialization voltage or a sensing voltage) to the driving transistor TR of each of the subpixels SP1, SP2, SP3 and SP4 provided in the display area DA.

Each of the at least one data line may supply a data voltage to at least one of the subpixels SP1, SP2, SP3 and SP4 provided in the display area DA. For example, a first data line may supply a first data voltage to the driving transistor TR of each of the first and third subpixels SP1 and SP3, and a second data line may supply a second data voltage to the driving transistor TR of each of the second and fourth subpixels SP2 and SP4.

The pixel power line may supply a first power source to the first electrode 120 of each of the subpixels SP1, SP2, SP3 and SP4. The common power line may supply a second power source to the second electrodes 140 of each of the subpixels SP1, SP2, SP3 and SP4.

The switching transistor is switched in accordance with the scan signal supplied to the scan line to supply the data voltage supplied from the data line to the driving transistor TR.

The sensing transistor serves to sense a deviation in a threshold voltage of the driving transistor TR, which causes deterioration of image quality.

The driving transistor TR is switched in accordance with the data voltage supplied from the switching thin film transistor to generate a data current from a power source supplied from the pixel power line and supply the data current to the first electrode 120 of the subpixel. The driving transistor TR is provided for each of the subpixels SP1, SP2, SP3 and SP4, and includes an active layer ACT, a gate electrode GE, a source electrode SE and a drain electrode DE.

The capacitor serves to maintain the data voltage supplied to the driving transistor TR for one frame. The capacitor may include a first capacitor electrode and a second capacitor electrode, but is not limited thereto. In another aspect, the capacitor may include three capacitor electrodes.

In detail, an active layer ACT may be provided over a first substrate 111. The active layer ACT may be formed of a silicon-based semiconductor material or an oxide-based semiconductor material.

A light shielding layer LS for shielding external light incident on the active layer ACT may be provided between the active layer ACT and the first substrate 111. The light-shielding layer LS may be formed of a material having conductivity, and may be formed of a single layer or multi-layer made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light shielding layer LS and the active layer ACT.

A gate insulating layer GI may be provided over the active layer ACT. The gate insulating layer GI may be formed of an inorganic film, for example, a silicon oxide film (SiOX), a silicon nitride film (SiNx), or a multi-film of SiOx and SiNx.

A gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic film, for example, a silicon oxide film (SiOX), a silicon nitride film (SiNx), or a multi-film of SiOx and SiNx.

The source electrode SE and the drain electrode DE may be provided over the interlayer dielectric layer ILD. The source electrode SE and the drain electrode DE may be connected to the active layer ACT through a contact hole that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

In addition, each of the plurality of signal lines, for example, the scan line, the data lines, reference line, pixel power line and common power line may be disposed on the same layer as any one of the light-shielding layer LS, the gate electrode GE, the source electrode SE and the drain electrode DE.

A passivation layer PAS for protecting the driving transistor TR may be provided over the source electrode SE and the drain electrode DE. A planarization layer PLN may be provided over the passivation layer PAS to planarize a step difference due to the driving transistor TR.

Light emitting elements comprised of a first electrode 120, a light emitting layer 130 and a cathode electrode 140, and a bank BK are provided over the planarization layer PLN.

The first electrode 120 may be provided for each of the subpixels SP1, SP2, SP3 and SP4. In detail, one first electrode 120 may be provided in the first subpixel SP1, another first electrode 120 may be provided in the second subpixel SP2, still another first electrode 120 may be provided in the third subpixel SP3, and further still another first electrode 120 may be provided in the fourth subpixel SP4. The first electrode 120 is not provided in the transmissive area TA.

The first electrode 120 provided in each of the plurality of subpixels SP1, SP2, SP3 and SP4 may include a plurality of divided electrodes 122, a plurality of connection electrodes 124, and a transistor contact portion 126.

The plurality of divided electrodes 122 may be provided over a planarization layer PLN. The plurality of divided electrodes 122 may include two or more, and may be disposed to be spaced apart from each other in the first direction (e.g., X-axis direction) or the second direction (e.g., Y-axis direction). For example, the first electrode 120 may include eight divided electrodes 122 disposed based on the transistor contact portion TCT as shown in FIGS. 4 and 5, but is not limited thereto. The first electrode 120 may include two to seven divided electrodes 122, or may include nine or more divided electrodes.

As the number of divided electrodes 122 included in one first electrode 120 is smaller, an aperture ratio may be increased, but a size of an area that becomes a dark spot due to particles is increased, whereby yield may be reduced. On the other hand, as the number of divided electrodes 122 included in one first electrode 120 is increased, the aperture ratio may be reduced, but the size of the area that becomes a dark spot due to the particles may be reduced, whereby yield may be increased.

As shown in FIG. 4, when the number of divided electrodes included in one first electrode 120 is 8, the aperture ratio may be reduced, but the size of the area that becomes a dark spot due to particles may be reduced, whereby yield may be improved. Meanwhile, when the number of divided electrodes included in one first electrode 120 is 2, yield is reduced as compared with the first electrode 120 shown in FIG. 4, but the aperture ratio may be improved.

For convenience of description, the following description will be based on that the plurality of divided electrodes 122 are 8.

The transistor contact portion 126 may be provided in the same layer as the plurality of divided electrodes 122. The transistor contact portion 126 may be disposed to be spaced apart from the plurality of divided electrodes 122 between the plurality of divided electrodes 122. The transistor contact portion 126 may be connected with the driving transistor TR. In detail, the transistor contact portion 126 may be connected to a source electrode SE or a drain electrode of the driving transistor TR through a contact hole ACH that passes through the planarization layer PLN and the passivation layer PAS.

The transistor contact portion 126 may have a polygonal shape covering at least a portion of the contact hole ACH. For example, the transistor contact portion 126 may have a rectangular shape, but is not limited thereto. The transistor contact portion 126 may have various shapes such as a triangular shape and a hexagonal shape.

The transistor contact portion 126 includes a plurality of sides, and the connection electrode 124 may be connected to at least two of the plurality of sides. For example, the transistor contact portion 126 may have a rectangular shape, and may include four sides. Two connection electrodes 124 may be connected to each of the four sides of the transistor contact portion 126.

The plurality of divided electrodes 122 and the transistor contact portion 126 may be formed of a metal material having high reflectance, such as a deposited structure (Ti/Al/Ti) of Al and Ti, a deposited structure (ITO/Al/ITO) of Al and ITO, Ag alloy, a deposited structure (ITO/Ag alloy/ITO) of Ag alloy and ITO, MoTi alloy, and a deposited structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti).

The connection electrode 124 may connect the divided electrode 122 and the transistor contact portion 126. The connection electrodes 124 may include a plurality of connection electrodes 124 and the plurality of connection electrodes 124 may correspond to the plurality of divided electrodes 122. That is, each of the plurality of divided electrodes 122 may correspond to one connection electrode 124.

Each of the plurality of connection electrodes 124 may be provided on the same layer as the active layer ACT of the driving transistor TR, and may connect the corresponding divided electrode 122 with the transistor contact portion 126. At this time, each of the plurality of connection electrodes 124 may be disposed between the corresponding divided electrode 122 and the transistor contact portion 126.

One end of each of the plurality of connection electrodes 124 may be connected to the divided electrode 122 through a first contact hole CH1 passing through a plurality of insulating layers GI, ILD, PAS and PLN. The other end of each of the plurality of connection electrodes 124 may be connected to the transistor contact portion 126 through a second contact hole CH2 passing through the plurality of insulating layers GI, ILD, PAS and PLN.

The connection electrode 124 may be formed of the same material as the active layer ACT of the driving transistor TR. The connection electrode 124 may be made of an oxide metal such as ZnO, Ga2O3, In2O3, and SnO2, and may be conductorized by doping a reactive metal material on at least a portion thereof.

In detail, the connection electrode 124 may include a conductor portion 1241 that is conductorized, and a non-conductor portion 1242 that is not conductorized. The conductor portion 1241 corresponds to a portion conductorized by doping a reactive metal material on an oxide metal inside the connection electrode 124. For example, the conductor portion 1241 may be formed of IGZO, which is a compound in which indium (In) and gallium (Ga) are doped on a zinc oxide (ZnO) compound.

The non-conductor portion 1242 corresponds to a portion that remains as a non-conductor without doping the reactive metal material on the oxide metal inside the connection electrode 124. For example, the non-conductor portion 1242 may be formed of zinc oxide (ZnO).

Since the non-conductor portion 1242 is not conductorized, a signal (current) of the driving transistor TR supplied through the transistor contact portion 126 does not flow to the divided electrode 122. That is, the non-conductor portion 1242 may form a high resistance area HRA having resistance higher than that of the conductor portion 1241. The non-conductor portion 1242 may be disposed in the middle of the connection electrode 124 as shown in FIG. 6. That is, the non-conductor portion 1242 may be disposed between a first connection area CA1 overlapped with the first contact hole CH1 and a second connection area CA2 overlapped with the second contact hole CH2 in the connection electrode 124.

Since the conductor portion 1241 is conductorized, the signal (current) of the driving transistor TR supplied through the transistor contact portion 126 may be provided to the divided electrode 122. To this end, the conductor portion 1241 may include a first conductor portion 1241*a*, a second conductor portion 1241*b*, a third conductor portion 1241*c* and a fourth conductor portion 1241*d*.

The first conductor portion 1241*a* may be disposed over a first side of the non-conductor portion 1242 to provide a first path CP1 through which a signal (current) flows from the transistor contact portion 126 to the divided electrode 122. The first conductor portion 1241*a* may form a first path area CPA1 through which a signal (current) flows from the transistor contact portion 126 to the divided electrode 122 between the third conductor portion 1241*c* and the fourth conductor portion 1241*d*.

The second conductor portion 1241*b* may be disposed over a second side of the non-conductor portion 1242 to provide a second path CP2 through which a signal (current) flows from the transistor contact portion 126 to the divided electrode 122. At this time, the first side and the second side may face each other. The second conductor portion 1241*b* may form a second path area CPA2 through which a signal (current) flows from the transistor contact portion 126 to the divided electrode 122 between the third conductor portion 1241*d* and the fourth conductor portion 1241*d*. The second path area CPA2 may be spaced apart from the first path area CPA1 with the high resistance area HRA interposed therebetween.

The third conductor portion 1241*c* may be disposed over a third side of the non-conductor portion 1242, and may overlap at least a portion of the first contact hole CH1. The third conductor portion 1241*c* may be connected with the divided electrode 122 through the first contact hole CH1. The third conductor portion 1241*c* may overlap at least a portion of the first contact hole CH1 to form a first connection area CA1 connected with the divided electrode 122.

The fourth conductor portion 1241*d* may be disposed over a fourth side of the non-conductor portion 1242, and may overlap at least a portion of the second contact hole CH2. The fourth conductor portion 1241*d* may be connected with the transistor contact portion 126 through the second contact hole CH2. The fourth conductor portion 1241*d* may overlap at least a portion of the second contact hole CH2 to form a second connection area CA2 connected with the transistor contact portion 126.

As a result, the signal (current) supplied from the transistor contact portion 126 through the second contact hole CH2 may be transferred to the divided electrode 122 through a first path CP1 comprised of the fourth conductor portion 1241d, the first conductor portion 1241a and the third conductor portion 1241c. Alternatively, the signal (current) supplied from the transistor contact portion 126 through the second contact hole CH2 may be transferred to the divided electrode 122 through a second path CP2 comprised of the fourth conductor portion 1241d, the second conductor portion 1241b and the third conductor portion 1241c.

Although FIG. 6 shows that a first path area CPA1 and a second path area CPA2 are formed over the first and second sides of the non-conductor portion 1242, respectively, to provided two paths through which the current flows, the aspect of the present disclosure is not limited thereto. In another aspect, the connection electrode 124 may be provided with only one of the first path area CPA1 and the second path area CPA2.

The display panel 110 according to one aspect of the present disclosure is characterized in that a high resistance area HRA is provided in each of the connection electrodes 124.

The connection electrode 124 may have a width W1 smaller than a width of the divided electrode 122. Since the connection electrode 124 is provided to be thinner than the divided electrode 122, resistance of the connection electrode 124 may be greater than that of the divided electrodes 122.

In addition, the connecting electrode 124 may be provided with a non-conductor portion 1242, that is, a high resistance area HRA, to which a current does not flow, at the center. Therefore, the current may only flow to the first path area CPA1 or the second path area CPA2 of the connection electrode 124. At this time, since the first path area CPA1 and the second path area CPA2 of the connection electrode 124 are disposed with the high resistance area HRA interposed therebetween, a width W2 of each of the first path area CPA1 and the second path area CPA2 of the connection electrode 124 may be narrower than the entire width W1. Since the width W2 of each of the first and second path areas CPA1 and CPA2 is very narrow, resistance of the connection electrode 124 may be large.

The connection electrode 124 described as above may have high resistance even in the first path area CPA1 and the second path area CPA2 as well as the high resistance area HRA. Therefore, when particles occur in the divided electrode 122, the connection electrode 124 may be disconnected from the high resistance area HRA to the first path area CPA1 and the second path area CPA2.

In detail, in the display panel 110 according to one aspect of the present disclosure, as shown in FIG. 8, particles P may occur in any one of the plurality of divided electrodes 122. When particles P occur in any one of the divided electrodes 122, the divided electrode 122 in which particles P occur may generate a short with the second electrode 140. Therefore, the organic light emitting layer 130 provided over the divided electrode 122 in which the particles P occur does not emit light.

In the display panel 110 according to one aspect of the present disclosure, the divided electrode 122 in which particles P occur is disconnected from the divided electrodes 122 in which particles P do not occur, whereby the organic light emitting layer 130 provided over the divided electrodes 122 in which particles P do not occur may emit light.

In the display panel 110 according to one aspect of the present disclosure, the high resistance area HRA may be provided in the connection electrode 124 so that the connection electrode 124 may be disconnected by high resistance.

When the divided electrode 122 in which the particles P occur is short-circuited with the second electrode 140, the current may be concentrated on the divided electrode 122 short-circuited with the second electrode 140. Therefore, the current may be concentrated on the connection electrode 124 connected with the divided electrode 122 in which the particles P occur.

The connection electrode 124 may have resistance higher than that of the divided electrode 122 as described above. Therefore, the connection electrode 124 connected with the divided electrode 122 in which the particles P occur may generate heat higher than that of the divided electrode 122.

Furthermore, the connection electrode 124 may be provided with a high resistance area HRA. Since the high resistance area HRA is made of oxide metal that is not conductorized, its resistance is very large. Also, the connection electrode 124 may include a first path area CPA1 and a second path area CPA2 over first and second sides of the high resistance area HRA. Since the first path area CPA1 and the second path area CPA2 are conductorized but have a very narrow width W2, their resistance is greater than resistance of the divided electrode 122.

When the current is concentrated on the connection electrode 124 connected with the divided electrode 122 in which the particles P occur, burst may occur in the connection electrode 124 due to high resistance in the high resistance area HRA. Thus, the non-conductor portion 1242 of the connection electrode 124 may be disconnected as shown in FIG. 8. In addition, resistance of the first path area CPA1 and the second path area CPA2 is increased by the narrow width W2, whereby the conductor portion 1241 of the first path area CPA1 and the second path area CPA2 may also be disconnected.

When the connection electrode 124 connected with the divided electrode 122 in which the particles P occur is disconnected, the divided electrode 122 in which the particles P occur is electrically separated from the transistor contact portion 126, and thus cannot be supplied with the signal from the driving transistor TR. As a result, the area where the divided electrode 122 in which the particles P occur is formed becomes a dark spot.

However, the divided electrodes 122 in which particles P do not occur are electrically separated from the divided electrode 122 in which the particles P occur, and their connection with the transistor contact portion 126 may be maintained. Therefore, the divided electrodes 122 in which the particles P do not occur may be supplied with a signal from the driving transistor TR through the transistor contact portion 126.

As a result, in the display panel 110 according to one aspect of the present disclosure, only the area provided with the divided electrode 122 in which particles P occur among the plurality of divided electrodes 122 becomes a dark spot, and light may normally be emitted in the area provided with the divided electrodes 122 in which particles P do not occur. The display panel 110 according to one aspect of the present disclosure may reduce or minimize the size of the light emission area that becomes a dark spot when the particles P occur.

A bank BK may be provided over the planarization layer PLN. In addition, the bank BK may be provided between the first electrodes 120 provided in each of the first to fourth subpixels SP1, SP2, SP3 and SP4. Further, the bank BK may also be provided between the plurality of divided electrodes 122 provided in each of the first electrodes 120. At this time, the bank BK may be provided to cover or at least partially cover edges of each of the plurality of divided electrodes 122 and expose a portion of each of the plurality of divided electrodes 122. Therefore, the bank BK may prevent light emission efficiency from being deteriorated due to the current concentrated on ends of each of the plurality of divided electrodes 122.

Meanwhile, the bank BK may be provided over the transistor contact portion TCT provided in each of the first electrodes 120. On the other hand, the bank BK may expose the plurality of connection electrodes 124 without covering them. Particularly, the bank BK may expose the high resistance area HRA of each of the plurality of connection electrodes 124.

A plurality of insulating layers GI, ILD, PAS and PLN may be provided between the plurality of connection electrodes 124 and the plurality of divided electrodes 122. The plurality of insulating layers GI, ILD, PAS and PLN may be provided over a portion of the plurality of connection electrodes 124. For example, the plurality of insulating layers GI, ILD, PAS and PLN may be provided over at least a portion of each of the first connection area CA1 and the second connection area CA2 of the plurality of connection electrodes 124. However, the plurality of insulating layers GI, ILD, PAS and PLN may expose the high resistance area HRA, the first path area CPA1 and the second path area CPA2 of the plurality of connection electrodes 124 without covering them. The bank BK may not be provided on the exposed high resistance area HRA.

Therefore, in the display panel 110 according to one aspect of the present disclosure, when the current is concentrated on any one of the plurality of connection electrodes 124 and thus burst occurs in the corresponding connection electrode, the plurality of insulating layers GI, ILD, PAS and PLN and the bank BK may be prevented from being damaged. In addition, the display panel 110 according to one aspect of the present disclosure may reduce or minimize influence of the plurality of insulating layers GI, ILD, PAS, PLN and the bank BK, which are damaged, on the peripheral elements.

Meanwhile, the bank BK may define emission areas EA1, EA2, EA3 and EA4 of each of the subpixels SP1, SP2, SP3 and SP4. The emission areas EA1, EA2, EA3 and EA4 of each of the subpixels SP1, SP2, SP3 and SP4 indicate areas in which the first electrode 120, specifically the divided electrodes 122, the organic light emitting layer 130 and the second electrode 140 are sequentially deposited so that holes from the divided electrodes 122 and electrons from the second electrode 140 are combined with each other in the organic light emitting layer 130 to emit light. In this case, the area in which the bank BK is provided does not emit light, and thus becomes a non-light emission area, and the areas in which the bank BK is not provided and the divided electrodes 122 are exposed may be the light emission areas EA1, EA2, EA3 and EA4.

The bank BK may be formed of an organic film such as an acrylic resin, an epoxy resin, a phenolic resin, a polyamide resin and a polyimide resin.

The organic light emitting layer 130 may be provided over the first electrode 120. The organic light emitting layer 130 may directly be provided over at least a portion of the plurality of divided electrodes 122 and at least a portion of the plurality of connection electrodes 124. The organic light emitting layer 130 may directly be provided in the area of the plurality of divided electrodes 122, which is exposed without being covered by the bank BK. In addition, the organic light emitting layer 130 may directly be provided in the area of the plurality of connection electrodes 124, which is exposed without being covered by the plurality of insulating layers GI, ILD, PAS, PLN and the bank BK. In particular, the organic light emitting layer 130 may directly be provided over the non-conductor portion 1242 of the plurality of connection electrodes 124.

The organic light emitting layer 130 may be provided over the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transport layer and the electron transport layer, respectively and are combined with each other in the light emitting layer to emit light.

In one aspect, the organic light emitting layer 130 may be a common layer commonly provided in the subpixels SP1, SP2, SP3 and SP4. In this case, the light emitting layer may be a white light emitting layer for emitting white light.

In another aspect, in the organic light emitting layer 130, a light emitting layer may be provided for each of the subpixels SP1, SP2, SP3 and SP4. For example, a red light emitting layer for emitting red light may be provided in the first subpixel SP1, a green light emitting layer for emitting green light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

The second electrode 140 may be provided over the organic light emitting layer 130 and the bank BK. The second electrode 140 may also be provided in the transmissive area TA as well as the non-transmissive area NTA that includes a light emission area EA, but is not limited thereto. The second electrode 140 may be provided only in the non-transmissive area NTA that includes the light emission areas EA1, EA2, EA3 and EA4, and may not be provided in the transmissive area TA to improve transmittance.

The second electrode 140 may be a common layer that is commonly provided in the subpixels SP1, SP2, SP3 and SP4 to apply the same voltage. The cathode electrode 140 may be formed of a conductive material capable of transmitting light. For example, the cathode electrode 140 may be formed of a low resistance metal material such as silver (Ag) or an alloy of magnesium (Mg) and silver (Ag). The second electrode 140 may be cathode electrode.

An encapsulation layer 150 may be provided over the light emitting elements. The encapsulation layer 150 may be provided over the second electrode 140 to overlay the second electrode 140. The encapsulation layer 150 serves to prevent oxygen or moisture from being permeated into the organic light emitting layer 130 and the second electrode 140. To this end, the encapsulation layer 150 may include at least one inorganic film and at least one organic film.

Although not shown in FIG. 7 and FIG. 8, a capping layer may further be provided between the second electrode 140 and the encapsulation layer 150.

A color filter CF may be provided over the encapsulation layer 150. The color filter CF may be provided over one surface of the second substrate 112 facing the first substrate 111. In this case, the first substrate 111 provided with the encapsulation layer 150 and the second substrate 112 provided with the color filter CF may be bonded to each other by a separate adhesive layer (not shown). The adhesive layer (not shown) may be an optically clear resin layer (OCR) or an optically clear adhesive film (OCA).

The color filter CF may be provided to be patterned for each of the subpixels SP1, SP2, SP3 and SP4. In detail, the color filter CF may include a first color filter, a second color filter and a third color filter. The first color filter may be disposed to correspond to the light emission area EA1 of the first subpixel SP1, and may be a red color filter that transmits red light. The second color filter may be disposed to correspond to the light emission area EA2 of the second subpixel SP2, and may be a green color filter that transmits green light. The third color filter may be disposed to correspond to the light emission area EA3 of the third subpixel SP3, and may be a blue color filter that transmits blue light. In one aspect, the color filter CF may further include a fourth color filter. The fourth color filter may be disposed to correspond to the light emission area EA4 of the fourth subpixel SP4, and may be a white color filter that transmits white light. The white color filter may be formed of a transparent organic material that transmits white light.

A black matrix BM may be provided between the color filters CF and between the color filter CF and the transmissive area TA. The black matrix BM may be disposed between the subpixels SP1, SP2, SP3 and SP4 to prevent color mixture between adjacent subpixels SP1, SP2, SP3 and SP4 from occurring.

In addition, the black matrix BM may be disposed between the transmissive area TA and the plurality of subpixels SP1, SP2, SP3 and SP4 to prevent light emitted from each of the plurality of subpixels SP1, SP2, SP3 and SP4 from moving to the transmissive area TA.

The black matrix BM may include a material that absorbs light, for example, a black dye that absorbs all of the light in the visible wavelength range.

In the display panel 110 according to one aspect of the present disclosure, the plurality of divided electrodes 122 may be connected with the transistor contact portion 126 through the connection electrodes 124 disposed in one-to-one correspondence with the divided electrodes 122. In the display panel 110 according to one aspect of the present disclosure, the high resistance area HRA may be provided over the connection electrodes 124 that are disposed in one-to-one correspondence with the plurality of divided electrodes 122. In the display panel 110 according to one aspect of the present disclosure, when particles P occur in a portion of the plurality of divided electrodes 122 and thus the current is concentrated on the corresponding divided electrode, the high resistance area HRA of the connection electrode 124 may be disconnected.

Therefore, in the display panel 110 according to one aspect of the present disclosure, the area provided with the divided electrode 124, in which particles P occur, among the plurality of divided electrodes 122 may become a dark spot, and light may normally be emitted in the area provided with the divided electrodes 122 in which particles P do not occur. As a result, the display panel 110 according to one aspect of the present disclosure may reduce or minimize the size of the light emission area that becomes a dark spot when particles P occur.

In addition, the display panel 110 according to one aspect of the present disclosure may not affect peripheral elements because a process such as laser cutting is not performed.

In order to disconnect the divided electrode 122, in which particles occur, from the driving transistor TR, the connection electrode 124 connected with the divided electrode 122 in which particles occur is cut by a laser. In order to cut the connection electrode 124 into a laser, the other elements need to be spaced apart from the connection electrode 124, and the connection electrodes 124 need to be separated from each other. When a spaced distance is not ensured between the other elements and the connection electrode 124, the elements disposed around the connection electrode 124 during laser cutting may be damaged. In addition, when the spaced distance between the connection electrodes 124 is not ensured, the connection electrode 124 connected to the other divided electrode 122 may also be damaged, whereby all of the subpixels may become dark spots. Meanwhile, when the spaced distance between the other elements and the connection electrode 124 is ensured, an aperture ratio may be reduced and thus image quality may be deteriorated.

In the display panel 110 provided with the transmissive area TA, since the area in which the subpixels SP1, SP2, SP3 and SP4 are disposed is smaller than that of a general display panel 110, it may be difficult to make sure of a spaced distance between the other elements and the connection electrode 124. In addition, in the display panel 110, deterioration of image quality due to a decrease in the aperture ratio may be more remarkable than the general display panel 110.

In the display panel 110 according to one aspect of the present disclosure, the high resistance area HRA may be provided over each of the plurality of connection electrodes 124, whereby disconnection may occur in the high resistance area HRA even without laser cutting when particles occur on the divided electrode 122. The display panel 110 according to one aspect of the present disclosure may reduce or minimize influence on the peripheral elements when the connection electrode 124 is disconnected from the high resistance area HRA. Also, the display panel 110 according to one aspect of the present disclosure may reduce the spaced distance between the connection electrodes 124 and thus may not affect the connection electrodes 124 even though the number of the divided electrodes 122 is increased. Therefore, the display panel 110 according to one aspect of the present disclosure may improve yield.

Also, in the display panel 110 according to one aspect of the present disclosure, the connection electrode 124 is provided on the same layer as the active layer ACT of the driving transistor TR, whereby the degree of freedom in design of the connection electrode 124 may be increased, and an aperture ratio of the divided electrode 122 may be increased.

In addition, in the display panel 110 according to one aspect of the present disclosure, the plurality of insulating layers GI, ILD, PAS and PLN and the bank BK may not be provided on the high resistance area HRA of the plurality of connection electrodes 124. Therefore, in the display panel 110 according to one aspect of the present disclosure, when any one of the plurality of connection electrodes 124 is disconnected, the plurality of insulating layers GI, ILD, PAS and PLN and the bank BK may be prevented from being damaged. Also, the display panel 110 according to one aspect of the present disclosure may reduce or minimize influence of the plurality of insulating layers GI, ILD, PAS, PLN and the bank BK, which are damaged, on the peripheral elements.

In addition, in the display panel 110 according to one aspect of the present disclosure, the plurality of connection electrodes 124 may be disposed between the plurality of divided electrodes 122. In the display panel 110 according to one aspect of the present disclosure, since the plurality of connection electrodes 124 are not protruded toward the transmissive area TA, the plurality of connection electrodes 124 may not affect light transmittance of the transmissive area TA.

Figure 9:
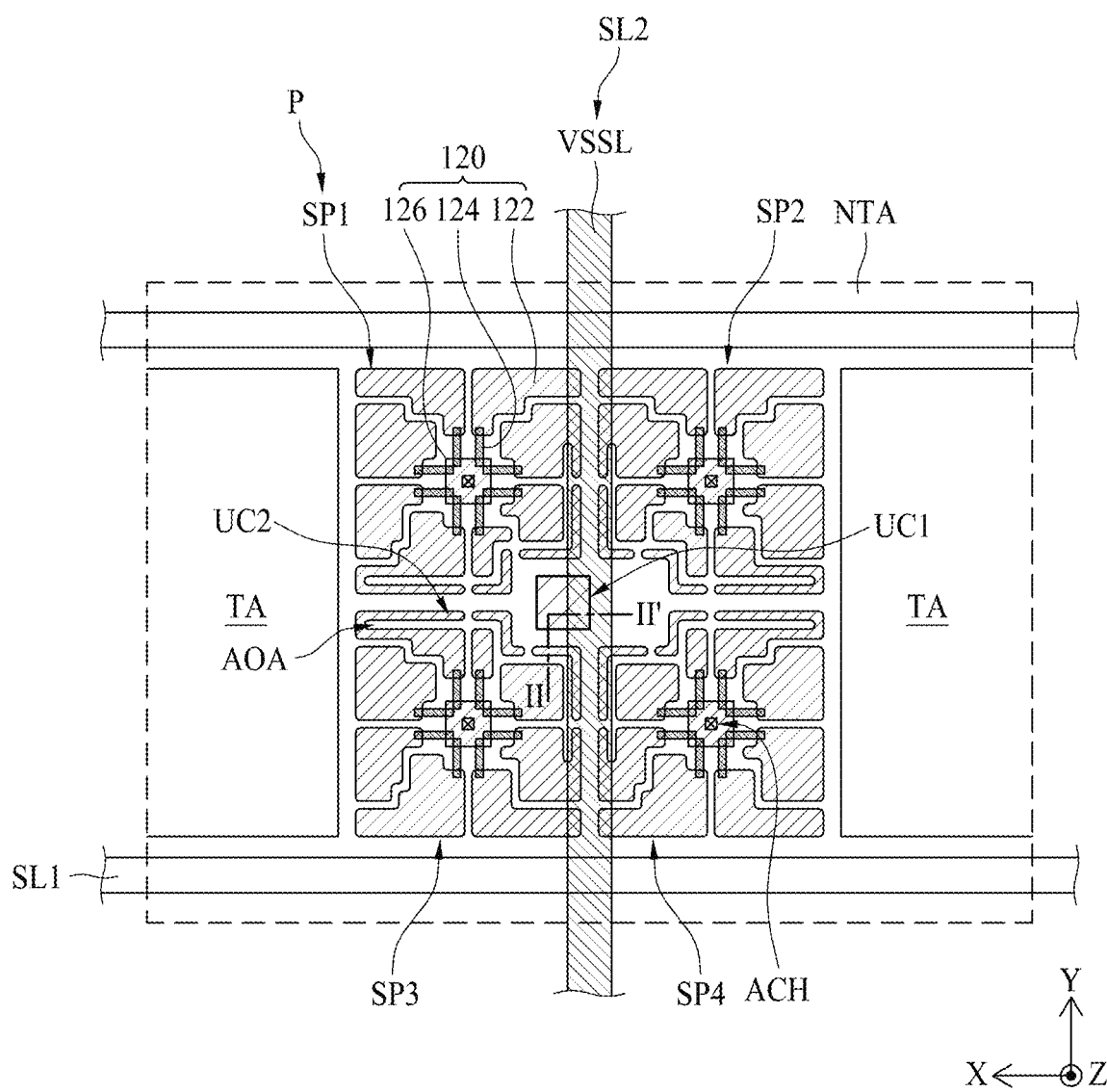
FIG. 9 is a view illustrating another example of a first electrode provided in a pixel shown in FIG. 3.
Figure 10:
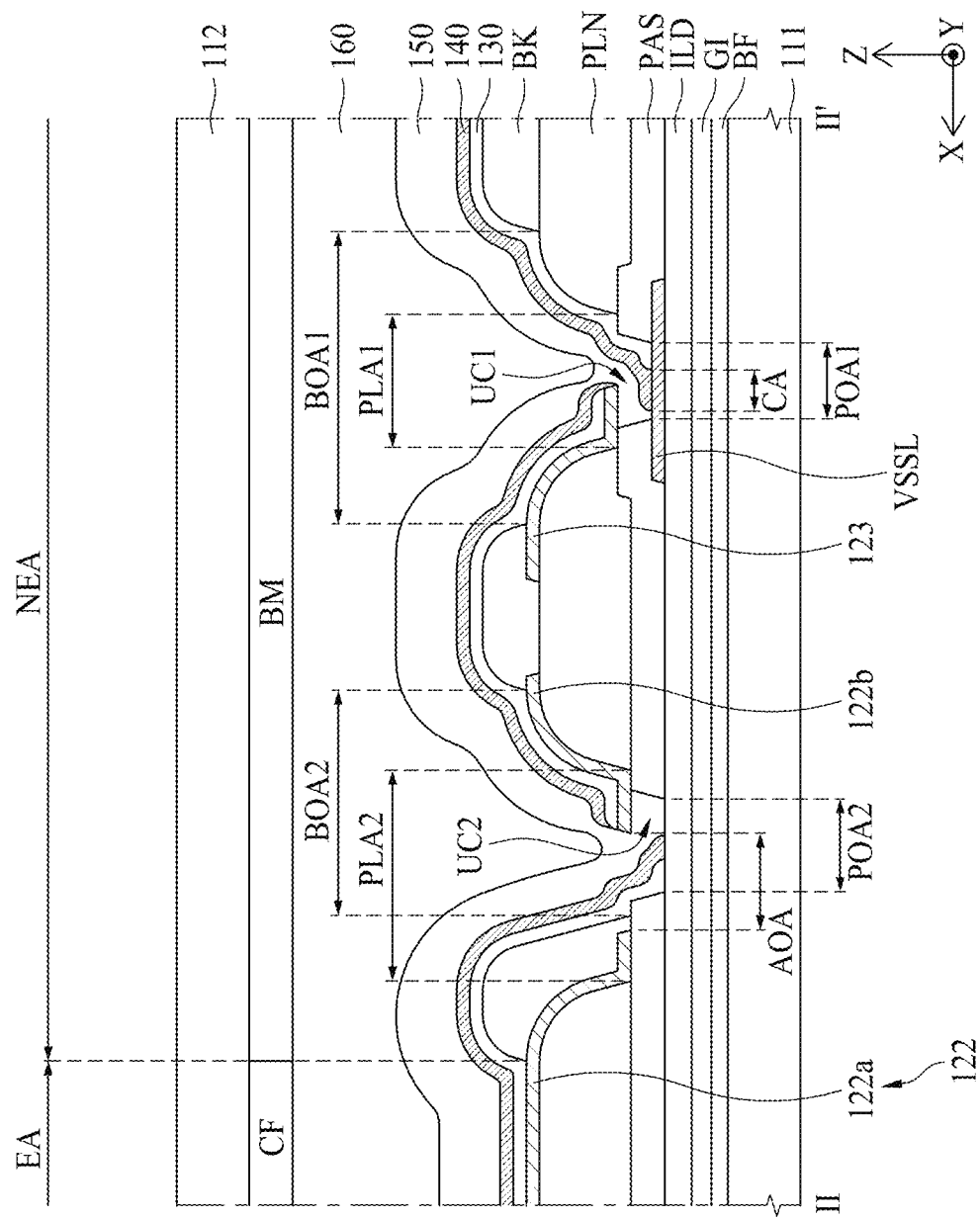
FIG. 10 is a cross-sectional view illustrating an example of line II-II' of FIG. 9.

FIG. 9 is a view illustrating another example of a first electrode provided in a pixel shown in FIG. 3, and FIG. 10 is a cross-sectional view illustrating an example of line II-II' of FIG. 9.

The display panel 110 shown in FIGS. 9 and 10 is different from the display panel 110 shown in FIGS. 3 to 8 in that a first undercut structure UC1 and a second undercut structure UC2 are provided.

The following description will be based on a difference from FIGS. 3 to 8, and the description of the elements substantially the same as those of the display panel 110 shown in FIGS. 3 to 8 will be omitted.

Referring to FIGS. 9 and 10, the display panel 110 includes a first undercut structure UC1 and a second undercut structure UC2 between the first to fourth subpixels SP1, SP2, SP3 and SP4.

The first undercut structure UC1 may be provided among the first to fourth subpixels SP1, SP2, SP3 and SP4, specifically among the first to fourth light emission areas EA1, EA2, EA3 and EA4. For example, the first undercut structure UC1 may be disposed in the middle of the first to fourth light emission areas EA1, EA2, EA3 and EA4.

The first undercut structure UC1 may expose at least a portion of the common power line VSSL among the first to fourth light emission areas EA1, EA2, EA3 and EA4. In detail, the first undercut structure UC1 may include a metal pattern 123 and at least one insulating layer provided between the first electrode 120, particularly the plurality of divided electrodes 122 and the substrate 111.

For example, the first undercut structure UC1 may include a passivation layer PAS and a metal pattern 123 provided over the passivation layer PAS. The passivation layer PAS may be provided over the common power line VSSL, and may be provided with a first passivation layer opening area POA1 that exposes at least a portion of the common power line VSSL. In addition, the planarization layer PLN may be provided over the passivation layer PAS, and may be provided with a first planarization layer opening area PLA1 having a size wider than the first passivation layer opening area POA1 so that the first passivation layer opening area POA1 may be exposed.

The metal pattern 123 may be disposed on the same layer as the first electrode 120, particularly the plurality of divided electrodes 122, and may be disposed to be spaced apart from the plurality of divided electrodes 122. The metal pattern 123 may be provided over the passivation layer PAS and the planarization layer PLN. At this time, the metal pattern 123 may be provided to cover at least a portion of the first passivation layer opening area POA1 of the passivation layer PAS. That is, the metal pattern 123 may be protruded from the passivation layer PAS to the first passivation layer opening area POA1, and at least a portion thereof may overlap the first passivation layer opening area POA1. Therefore, the first undercut structure UC1 comprised of the metal pattern 123 and the passivation layer PAS may be provided.

Meanwhile, a bank BK may be provided over the metal pattern 123, and may be provided with a first bank opening area BOA1 having a size wider than the first passivation layer opening area POA1 so that the first passivation layer opening area POA1 may be exposed.

The organic light emitting layer 130 and the second electrode 140 may be disconnected by the first undercut structure UC1. The organic light emitting layer 130 may be disconnected from the end of the metal pattern 123 of the first undercut structure UC1. The organic light emitting layer 130 may be deposited over the common power line VSSL exposed by the first undercut structure UC1. At this time, the organic light emitting layer 130 may be disposed over only a portion of the common power line VSSL without fully covering the common power line VSSL exposed by the first undercut structure UC1. Thus, at least a portion of the common power line VSSL, for example, an area provided below the metal pattern 123 of the first undercut structure may still be exposed.

The second electrode 140 deposited on the organic light emitting layer 130 may also be disconnected at the end of the metal pattern 123 of the first undercut structure UC1. The second electrode 140 may be deposited on the common power line VSSL exposed by the first undercut structure UC1. Since the second electrode 140 has good step coverage, the second electrode 140 may be deposited with an area wider than the light emitting layer 130. Therefore, the second electrode 140 may be deposited on the common power line VSSL which is still exposed without being covered by the organic light emitting layer 130. As a result, the common power line VSSL may be provided with a contact area CA that is in contact with the second electrode 140 in the area exposed by the first undercut structure UC1, and may supply the second power source to the second electrode 140 in the contact area CA.

As described above, in the display panel 110 according to another aspect of the present disclosure, the second electrode 140 may be connected to the common power line VSSL using the first undercut structure UC1. However, as shown in FIG. 10, an encapsulation layer 150 provided over the second electrode 140 may be provided to be thin in the first undercut structure UC1 due to a step difference of the first undercut structure UC1. Therefore, encapsulation performance of the encapsulation layer 150 may be reduced in an area overlapped with the first undercut structure UC1, and external moisture or oxygen is likely to be permeated into the encapsulation layer 150. In particular, external moisture or oxygen may easily be permeated into the encapsulation layer 150 through the organic light emitting layer 130 provided over the end of the metal pattern 123 of the first undercut structure UC1. In this case, the permeated moisture or oxygen may be transferred to the organic light emitting layer 130 provided in the light emission area EA along the organic light emitting layer 130. Therefore, the light emitting element may easily be degraded.

In the display panel 110 according to one aspect of the present disclosure, the second electrode 140 may be provided to be in contact with a side portion of the metal pattern 123 while covering the organic light emitting layer 130 at the end of the metal pattern 123 of the first undercut structure UC1. Therefore, external moisture or oxygen may be prevented from being permeated into the organic light emitting layer 130 vulnerable to moisture.

Furthermore, the display panel 110 according to another aspect of the present disclosure includes a second undercut structure UC2 to prevent moisture or oxygen permeated in the area overlapped with the first undercut structure UC1 from being transferred to the light emitting element.

The second undercut structure UC2 may be provided among the first to fourth subpixels SP1, SP2, SP3 and SP4, specifically between each of the first to fourth light emission areas EA1, EA2, EA3 and EA4 and the first undercut structure UC1. The second undercut structure UC2 may be provided in a plural number. For example, one second undercut structure UC2 may be provided between the first light emission area EA1 and the first undercut structure UC1, and another second undercut structure UC2 may be provided between the second light emission area EA2 and the first undercut structure UC1. Still another second undercut structure UC2 may be provided between the third light emission area EA3 and the first undercut structure UC1, and further still another second undercut structure UC2 may be provided between the fourth light emission area EA4 and the first undercut structure UC1.

In the display panel 110 according to another aspect of the present disclosure, a first opening area AOA may be provided in the first electrode 120 provided in each of the first to fourth subpixels SP1, SP2, SP3 and SP4 to form the second undercut structure UC2.

In detail, the first electrode 120 provided in each of the first to fourth subpixels SP1, SP2, SP3 and SP4 may include a first opening area AOA, a first electrode pattern 122a and a second electrode pattern 121b, as shown in FIG. 10. In particular, at least one of the plurality of divided electrodes 122 may include a first opening area AOA, a first electrode pattern 122a and a second electrode pattern 121b.

At least one of the plurality of divided electrodes 122 may be provided with a first opening area AOA in an edge area. For example, at least one divided electrode 122 adjacent to the contact area CTA of the common power line VSSL of the plurality of divided electrodes 122 may be provided with a first opening area AOA in an edge area. At this time, at least one divided electrode 122 adjacent to the contact area CTA of the common power line VSSL may include a plurality of sides, and may be provided with a first opening area AOA in an edge area of at least one side adjacent to the contact area CA of the common power line VSSL among the plurality of sides. The first opening area AOA of the first electrode 120 may be extended as much as a predetermined length along the edge area. For example, the first opening area AOA may be provided in a line shape along the edge area.

The first electrode pattern 122a may be disposed over a first side of the first opening area AOA, and may overlap a light emission area EA in which light is emitted from the organic light emitting layer 130. The first electrode pattern 122a may be connected to the source electrode SE or the drain electrode of the driving transistor TR through a contact hole ACH. An end of the first electrode pattern 122a may be covered by the bank BK.

The second electrode pattern 121b may be disposed over a second side facing the first side of the first opening area AOA, and may overlap with a non-light emission area NEA in which light is not emitted from the organic light emitting layer 130.

In the display panel 110 according to another aspect of the present disclosure, the second undercut structure UC2 may be provided using the second electrode pattern 121b of the divided electrode 122, and the organic light emitting layer 130 and the second electrode 140 may be disconnected by the second undercut structure UC2.

In detail, the second undercut structure UC2 may include the second electrode pattern 121b of the divided electrode 122, and at least one insulating layer provided between the first electrode 120 and the substrate 111.

For example, the second undercut structure UC2 may include a passivation layer PAS and a second electrode pattern 121b provided over the passivation layer PAS. The passivation layer PAS may be provided with a second passivation layer opening area POA2 at least partially overlapping the first opening area AOA of the divided electrode 122. In addition, the planarization layer PLN may be provided over the passivation layer PAS, and may be provided with a second planarization layer opening area PLA2 having a size wider than the second passivation layer opening area POA2 so that the second passivation layer opening area POA2 may be exposed.

The second electrode pattern 121b may be provided over the passivation layer PAS and the planarization layer PLN. At this time, the second electrode pattern 121b may be provided over the passivation layer PAS to cover at least a portion of the second passivation layer opening area POA2. That is, the second electrode pattern 121b may be protruded from the passivation layer PAS to the second passivation layer opening area POA2, and at least a portion thereof may overlap the second passivation layer opening area POA2. Therefore, the second undercut structure UC2 comprised of the second electrode pattern 121b and the passivation layer PAS may be provided.

Meanwhile, the bank BK may be provided over the second electrode pattern 121b, and may be provided with a second bank opening area BOA2 having a size wider than the second passivation layer opening area POA2 so that the second passivation layer opening area POA2 may be exposed. At this time, the bank BK may be disposed over the edge of the first electrode pattern 122a and at least a portion of the second electrode pattern 121b.

The organic light emitting layer 130 and the second electrode 140 may be disconnected by the second undercut structure UC2. The organic light emitting layer 130 may be disconnected from the end of the second electrode pattern 121b of the second undercut structure UC2. Therefore, the organic light emitting layer 130 provided over the first electrode pattern 122a may be spaced apart from the organic light emitting layer 130 provided over the second electrode pattern 121b.

In addition, the second electrode 140 deposited on the organic light emitting layer 130 may also be disconnected from the end of the second electrode pattern 121b of the second undercut structure UC2. Therefore, the second electrode 140 provided over the first electrode pattern 122a may be spaced apart from the second electrode 140 provided over the second electrode pattern 121b.

As a result, the second undercut structure UC2 may disconnect the organic light emitting layer 130 from the second electrode 140 between each of the first to fourth light emission areas EA1, EA2, EA3 and EA4 and the first undercut structure UC1. Therefore, the display panel 110 according to another aspect of the present disclosure may prevent moisture or oxygen permeated in the area overlapped with the first undercut structure UC1 from being transferred to the light emitting element.

In addition, the display panel 110 according to one aspect of the present disclosure may make sure of an aperture ratio and increase light transmittance of the transmissive area as the contact area between the second electrode 140 and the common power line VSS may be disposed among the plurality of subpixels SP1, SP2, SP3 and SP4 without being protruded to the transmissive area.

According to the present disclosure, the following advantageous effects may be obtained.

In the present disclosure, the high resistance area may be provided in the connection electrodes disposed in one-to-one correspondence with the plurality of divided electrodes. According to the present disclosure, when particles occur in a portion of the plurality of divided electrodes and the current is concentrated on the corresponding divided electrode, only the high resistance area of the connection electrode connected with the corresponding divided electrode may be disconnected. Therefore, the present disclosure may reduce or minimize the size of the light emission area that becomes a dark spot when particles occur.

In addition, in the present disclosure, the high resistance area of the connection electrode may be disconnected without a separate laser cutting process, whereby the spaced distance between the connection electrodes may be reduced. The present disclosure may increase the number of the divided electrodes, and thus may improve yield.

Also, in the present disclosure, the connection electrode is provided on the same layer as the active layer of the driving transistor, whereby the degree of freedom in design for the connection electrode may be increased, and an aperture ratio of the divided electrode may be increased.

Also, in the present disclosure, as the plurality of insulating films and the bank are not provided on the high resistance area of the plurality of connection electrodes, the plurality of insulating films and the bank may be prevented from being damaged even though any one of the plurality of connection electrodes is disconnected.

In addition, in the present disclosure, as the plurality of connection electrodes are disposed between the plurality of divided electrodes without being protruded toward the transmissive area, the plurality of connection electrodes may not affect light transmittance of the transmissive area.

It will be apparent to those skilled in the art that the present disclosure described above is not limited by the above-described aspects and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device capable of reducing size of light emission area that becomes dark spot, the display device comprising:
   a substrate provided with a display area for displaying an image by a plurality of subpixels, the display area including a transmissive area and a non-transmissive area;
   a plurality of first electrodes disposed over the substrate and provided in each of the plurality of subpixels;
   a plurality of driving transistors provided over the substrate and including an active layer, a gate electrode, a source electrode and a drain electrode;
   a light emitting layer provided over the plurality of first electrodes; and
   a second electrode provided over the light emitting layer,
   wherein each of the plurality of first electrodes includes:
   a plurality of divided electrodes spaced apart from one another;
   a transistor contact portion connected with the driving transistor through a contact hole; and
   a plurality of connection electrodes provided on a same layer as the active layer of the driving transistor and connecting each of the plurality of divided electrodes with the transistor contact portion,
   wherein the plurality of the connection electrodes are disposed in the non-transmissive area,
   wherein the display device further comprises a bank covering an edge area of each of the plurality of divided electrodes,
   wherein each of the plurality of connection electrodes includes a conductor portion that is conductorized and a non-conductor portion that is not conductorized, and
   wherein the plurality of connection electrodes are exposed without being covered by the bank in the non-conductor portion.

2. The display device of claim 1, wherein the plurality of connection electrodes correspond to the plurality of divided electrodes in one-to-one correspondence.

3. The display device of claim 1, wherein each of the plurality of connection electrodes is disposed between a corresponding divided electrode and the transistor contact portion.

4. The display device of claim 1, wherein each of the plurality of connection electrodes has one end connected to a corresponding divided electrode through a first contact hole and another end connected to the transistor contact portion through a second contact hole.

5. The display device of claim 1, wherein the conductor portion includes IGZO.

6. The display device of claim 1, wherein the non-conductor portion is a high resistance area having resistance higher than that of the conductor portion.

7. The display device of claim 1, wherein the non-conductor portion is disposed in a middle of each of the plurality of connection electrodes.

8. The display device of claim 1, wherein the conductor portion includes:
   a first conductor portion disposed to provide a first path through which a signal flows from the transistor contact portion to the divided electrode; and
   a second conductor portion disposed to provide a second path through which a signal flows from the transistor contact portion to the divided electrode,
   wherein the first conductor portion and the second conductor portion are disposed in a first direction with the non-conductor portion interposed therebetween.

9. The display device of claim 8, wherein the conductor portion includes:
   a third conductor portion disposed to be connected with the divided electrode through a first contact hole; and
   a fourth conductor portion disposed to be connected with the transistor contact portion through a second contact hole,
   wherein the third conductor portion and the fourth conductor portion are disposed in a second direction with the non-conductor portion interposed therebetween.

10. The display device of claim 1, wherein at least a portion of the plurality of connection electrodes is directly in contact with the light emitting layer.

11. The display device of claim 10, wherein the plurality of connection electrodes are directly in contact with the light emitting layer in the non-conductor portion.

12. A display device capable of reducing size of light emission area that becomes dark spot, the display device comprising:
   a substrate provided with transmissive areas and a non-transmissive area disposed between the transmissive areas;
   a driving transistor provided in the non-transmissive area over the substrate and including an active layer, a gate electrode, a source electrode and a drain electrode;
   a first electrode including a plurality of divided electrodes provided over the driving transistor and a plurality of connection electrodes provided on a same layer as the active layer of the driving transistor;
   a light emitting layer provided over the first electrode;

a second electrode provided over the light emitting layer; and wherein the plurality of the connection electrodes are disposed in the non-transmissive area, a bank covering an edge area of each of the plurality of divided electrodes, wherein each of the plurality of connection electrodes includes a conductor portion that is conductorized and a non-conductor portion that is not conductorized, and wherein the plurality of connection electrodes are exposed without being covered by the bank in the non-conductor portion.

13. The display device of claim 12, wherein the first electrode further includes a transistor contact portion provided on a same layer as the plurality of divided electrodes and is spaced apart from the plurality of divided electrodes.

14. The display device of claim 13, wherein the transistor contact portion is disposed between the plurality of divided electrodes.

15. The display device of claim 13, wherein each of the plurality of connection electrodes has one end connected to a corresponding divided electrode through a first contact hole and another end connected to the transistor contact portion through a second contact hole.

16. The display device of claim 12, wherein each of the plurality of connection electrodes includes a high resistance area.

17. The display device of claim 16, wherein the high resistance area is disposed between an area overlapping with a first contact hole and an area overlapping with a second contact hole in each of the plurality of connection electrodes.

18. The display device of claim 15, wherein each of the plurality of connection electrodes includes a first path area disposed to provide a first path through which a signal flows from the transistor contact portion to a divided electrode connected thereto through the first contact hole.

19. The display device of claim 18, wherein each of the plurality of connection electrodes further includes a second path area disposed to provide a second path through which a signal flows from the transistor contact portion to a divided electrode connected thereto through the first contact hole, and wherein the first path area and the second path area are disposed in a first direction with the high resistance area interposed therebetween.

20. The display device of claim 16, wherein the connection electrode connected with a divided electrode in which particles occur is disconnected from the high resistance area.

* * * * *